United States Patent
Yu et al.

(10) Patent No.: US 6,806,147 B1
(45) Date of Patent: Oct. 19, 2004

(54) METHOD AND APPARATUS FOR SUPPRESSING THE CHANNELING EFFECT IN HIGH ENERGY DEEP WELL IMPLANTATION

(75) Inventors: Bin Yu, Sunnyvale, CA (US); Che-Hoo Ng, San Martin, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 139 days.

(21) Appl. No.: 10/211,190

(22) Filed: Aug. 1, 2002

Related U.S. Application Data

(62) Division of application No. 09/495,075, filed on Jan. 31, 2001, now Pat. No. 6,459,141.
(60) Provisional application No. 60/166,763, filed on Nov. 22, 1999.

(51) Int. Cl.[7] ............................................. H01L 21/336
(52) U.S. Cl. ........................................ 438/289; 257/611
(58) Field of Search ................................ 438/150, 162, 438/166, 282, 289–291, 514, 526, 528, 543; 257/65, 347, 376, 607, 610–611

(56) References Cited

U.S. PATENT DOCUMENTS

| | | | | |
|---|---|---|---|---|
| 5,362,981 A | * | 11/1994 | Sato et al. | 257/371 |
| 5,646,073 A | * | 7/1997 | Grider et al. | 438/301 |
| 6,143,593 A | * | 11/2000 | Augusto | 438/199 |
| 6,245,618 B1 | * | 6/2001 | An et al. | 438/289 |
| 6,459,141 B2 | * | 10/2002 | Yu et al. | 257/611 |

* cited by examiner

*Primary Examiner*—David Nelms
*Assistant Examiner*—David Vu
(74) *Attorney, Agent, or Firm*—Farjami & Farjami LLP

(57) ABSTRACT

The invention provides an improved well structure for electrically separating n-channel and p-channel MOSFETs. The invention first forms a shallow well in a substrate. A buried amorphous layer is then formed below the shallow well. A deep well is then formed below the buried amorphous layer. The substrate is then subjected to a rapid thermal anneal to recrystallize the buried amorphous layer. The well structure is formed by the shallow well and the deep well. A conventional semiconductor device may then be formed above the well structure. The buried amorphous layer suppresses the channeling effect during the forming of the deep well without requiring a tilt angle.

8 Claims, 2 Drawing Sheets

METHOD AND APPARATUS FOR SUPPRESSING THE CHANNELING EFFECT IN HIGH ENERGY DEEP WELL IMPLANTATION

CROSS REFERENCE TO RELATED APPLICATIONS

This application is a divisional application of, and claims priority through, continued prosecution application U.S. Ser. No. 09/495,075, entitled "Method and Apparatus for Suppressing the Channeling Effect in High Energy Deep Well Implantation," filed Jan. 31 2000; now U.S. Pat. No. 6,459,141 which, in turn, claims priority from U.S. Ser. No. 60/166,763, entitled "Method and Apparatus for Suppressing the Channeling Effect in High Energy Deep Well Implantation," filed Nov. 22, 1999, by the same applicants.

FIELD OF THE INVENTION

The present invention relates to the manufacture of semiconductor chips. More specifically, the present invention relates to a method for providing a deep well in the production of CMOS devices.

BACKGROUND OF THE INVENTION

In CMOS fabrication processes, well (or tub) structures are needed to electrically separate n-channel and p-channel MOSFETs. High-energy (MeV) ion implantation is needed to form a deep well with a depth of 800 to 2,000 nm. The projection range $R_p$ of the high-energy implant is typically 400 to 1,000 nm. For such a high-energy implant, the channeling effect, in which the dopant profile possesses a long tail along certain crystal orientations, is a major problem in well formation. The channeling effect degrades the electrical isolation capability of a well.

For uniform implantation, a common practice involves implanting the dopant with a tilt angle rather than implanting vertically with respect to the silicon wafer (zero-tilt) in order to avoid axial channeling. However, due to present small transistor sizes, the tilt angle can distort the implant symmetry (i.e., the placement of precise doping and concentration). If scanning or batch implantation techniques are also used, this problem will be compounded. Therefore, avoiding axial channeling while using a zero tilt implant is desirable.

BRIEF SUMMARY OF THE INVENTION

Accordingly, the present invention method of fabricating a semiconductor device avoids axial channeling while using a zero tilt implant by forming a buried amorphous layer within the semiconductor substrate, forming a deep well layer below the buried amorphous layer, and then recrystallizing the buried amorphous layer. Advantages of the present invention include, but are not limited to, providing high-energy implants with minimal channeling effect as well as providing high-energy implants with minimal implant symmetry distortion. Other features of the present invention are disclosed or apparent in the section entitled: "DETAILED DESCRIPTION OF THE INVENTION."

BRIEF DESCRIPTION OF DRAWING

For a fuller understanding of the present invention, reference is made to the accompanying Drawing. Reference numbers refer to the same or equivalent parts of the present invention throughout the several figures of the Drawing.

DETAILED DESCRIPTION OF THE INVENTION AND BEST MODE OF THE INVENTION

Figure 1:
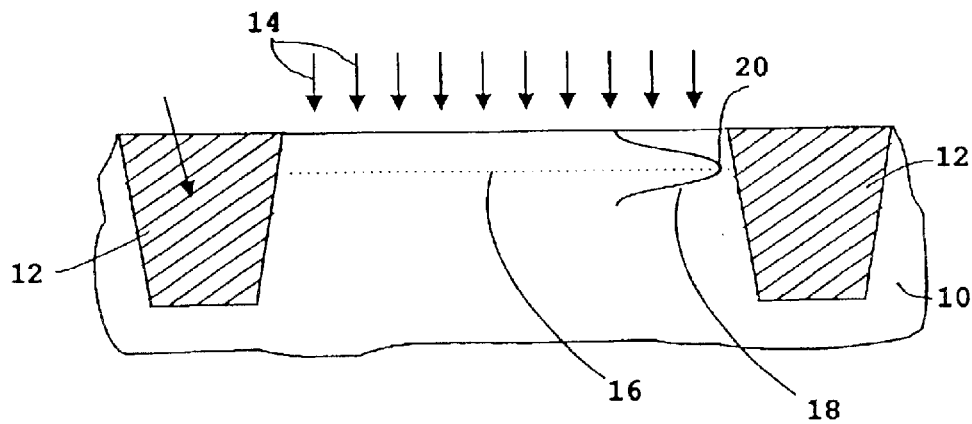
FIG. 1 is a cross-sectional view of a substrate undergoing a shallow well implant, in accordance with the present invention.

FIG. 1 is a cross-sectional view of a semiconductor substrate 10 with isolation trenches 12. The semiconductor substrate 10 is subjected to a shallow well implant 14 with a zero degree tilt to form a shallow well layer 16, which extends between the isolation trenches 12. A shallow well concentration curve 18 schematically illustrates the concentration of the implant according to depth within the substrate 10. The peak 20 of the shallow well concentration curve 18 is located at the depth within the substrate where the implant concentration is the highest. In the preferred embodiment, for a P-well, indium is used as the dopant for the shallow well implant 14. The indium is implanted with an energy of 90–140 keV and a dose of $5\text{–}8\times10^{12}$ atoms·cm$^{-2}$ to form a steep retrograde well (SRW) as the shallow well layer 16. The steep retrograde well suppresses source-to-body punch through leakage in a MOSFET while not degrading the carrier mobility in the surface channel.

Figure 2:
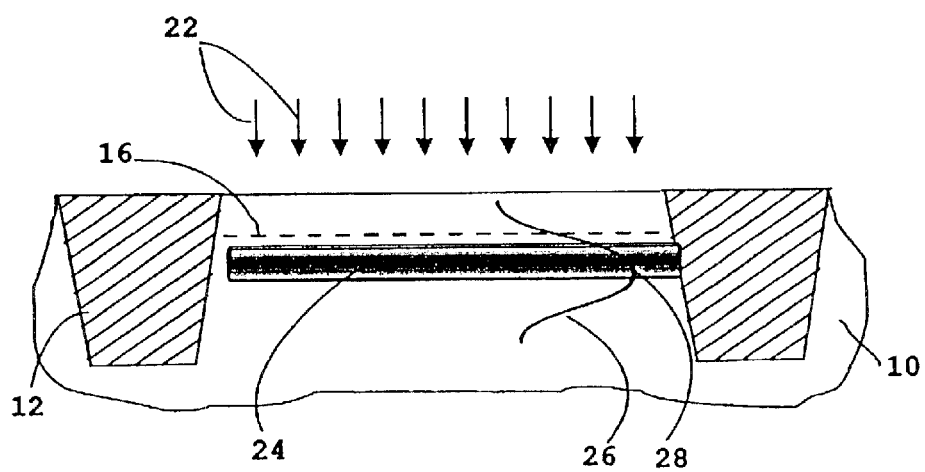
FIG. 2 is a cross-sectional view of the substrate, shown in FIG. 1, undergoing an amorphization implant, in accordance with the present invention.

FIG. 2 is a cross-sectional view of the semiconductor substrate 10 undergoing an amorphization implant 22 with a zero degree tilt to create a buried amorphous layer 24 below the shallow well layer 16. An amorphized silicon concentration curve 26 illustrates the concentration of the amorphized silicon according to the depth within the substrate 10. The peak 28 of the amorphized silicon concentration curve 26 is located at the depth within the substrate 10 where the amorphized silicon concentration is the highest. In the preferred embodiment, the amorphization implant 22 uses a species with a high atomic mass to form a relatively thin buried amorphous layer 24. Such species may be a neutral species (nondopant) such as silicon ($Si^+$) at 90 keV, germanium ($Ge^+$) at 180–200 keV, or xenon ($Xe^+$) at 300–340 keV or may be a non-neutral species (dopant) such as indium (In) at 300 keV. In the preferred embodiment, the peak 28 of the amorphized silicon concentration curve is deeper than about 50 nm from the surface of the substrate 10.

Figure 3:
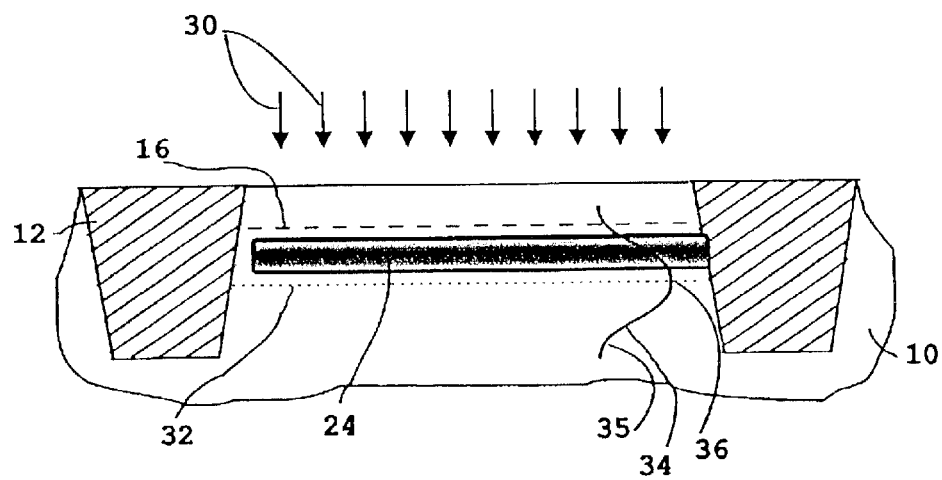
FIG. 3 is a cross-sectional view of the substrate, shown in FIG. 1, undergoing a deep well implant, in accordance with the present invention.

FIG. 3 is a cross-sectional view of the semiconductor substrate 10 undergoing a deep well implant 30 with a zero degree tilt to create a deep well layer 32 below the buried amorphous layer 24. In the preferred embodiment, for a P-well, boron is used as the dopant for the deep well implant 30. The boron is implanted with an energy of 0.2 to 4 MeV and a dose of $5\text{–}8\times10^{12}$ atoms·cm$^{-2}$. A deep well concentration curve 34 illustrates the concentration of the deep well implant according to the depth within the substrate 10. The peak 36 of the deep well concentration curve 34 being located at the depth within the substrate 10 where the deep well implant concentration is the highest. The deep well layer 32 being below the buried amorphous layer 24 is defined as the peak 36 of the deep well concentration curve 34 is below the peak 28 of the amorphized silicon concentration curve 26 so that most of the deep well implant 30 passes through most of the buried amorphous layer 24. The deep well concentration curve 34 has a tail 35 within the depth of the substrate 10 which is not long. In the prior art, a long tail would be caused by channeling into the silicon crystal. The amorphized silicon layer 24 lacks a crystal structure, which reduces channeling. The deep well implant helps to suppress CMOS latchup. The substrate 10 is then subjected to a low temperature rapid thermal anneal. In the preferred embodiment, the low temperature rapid thermal anneal is at a temperature of 550–600° C. for 10 to 20 minutes.

Figure 4:
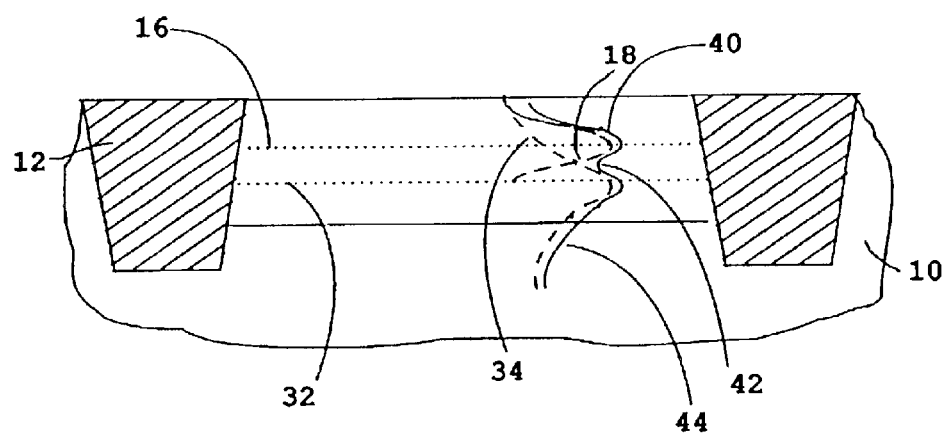
FIG. 4 is a cross-sectional view of the substrate, shown in FIG. 1, after rapid thermal annealing, in accordance with the present invention.

FIG. 4 is a cross-sectional view of the semiconductor substrate 10 after it has undergone the low temperature rapid thermal anneal. The rapid thermal anneal causes the buried amorphous layer to recrystallize, which eliminates the buried amorphous layer. The shallow well 16 and the deep well 32, which remain in the substrate 10, form a well (or tub) structure. A well structure curve 40 illustrates the concentration of dopant according to the depth within the substrate 10, which is also the sum of the concentrations from the shallow well layer 16 and the deep well layer 32 which are represented by the shallow well concentration curve 18 and the deep well concentration curve 34. The dopant concentration curve 40 has a reasonably flat peak area 42 and has a tail 44 which is not long, since the buried amorphous layer prevented channeling. Conventional techniques are then used to build a semiconductor device on the surface of the substrate 10 over the well structure between the isolation trenches 12.

Information as herein shown and described in detail is fully capable of attaining the above-described object of the invention and is understood to be the preferred embodiment of the present invention and is, thus, representative of the subject matter which is broadly contemplated by the present invention. The scope of the present invention fully encompasses other embodiments which may become obvious to those skilled in the art; and the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, for a device or a method to be encompassed by the present claims, the device or method need not address each and every problem sought to be solved by the present invention. Furthermore, no element, component, or method step in the present disclosure is intended to be dedicated to the public regardless of whether the element, component, or method step is explicitly recited in the claims. No claim element herein is to be construed under the provisions of 35 U.S.C. § 112, sixth paragraph, unless the element is expressly recited using the phrase "means for."

We claim:

1. A method for fabricating a semiconductor device, said method comprising steps of:

forming a shallow well layer by subjecting a semiconductor substrate to a shallow well implant with a substantially zero degree tilt;

forming a buried amorphous layer below said shallow well layer by subjecting said semiconductor substrate to an amorphization implant with a substantially zero degree tilt;

forming a deep well layer below said buried amorphous layer by subjecting said semiconductor substrate to a deep well implant with a substantially zero degree tilt.

2. The method of claim 1 wherein, for a P-well, indium ("In") is used as a dopant for said shallow well implant.

3. The method of claim 1 wherein boron ("B") is used as a dopant for said deep well implant.

4. The method of claim 1 wherein forming said shallow well layer comprises forming a steep retrograde well ("SRW").

5. A method for fabricating a semiconductor device, said method comprising steps of:

forming a shallow well layer by subjecting a semiconductor substrate to a shallow well implant with a substantially zero degree tilt;

forming a buried amorphous layer below said shallow well layer by subjecting said semiconductor substrate to an amorphization implant with a substantially zero degree tilt;

forming a deep well layer below said buried amorphous layer by subjecting said semiconductor substrate to a deep well implant with a substantially zero degree tilt, most of said deep well implant passing through most of said buried amorphous layer;

said method of forming said semiconductor device avoiding axial channeling and exhibiting minimal implant distortion.

6. The method of claim 5 wherein, for a P-well, indium ("In") is used as a dopant for said shallow well implant.

7. The method of claim 5 wherein boron ("B") is used as a dopant for said deep well implant.

8. The method of claim 5 wherein forming said shallow well layer comprises forming a steep retrograde well ("SRW").

* * * * *